(12) United States Patent
Sharps et al.

(10) Patent No.: US 7,759,572 B2
(45) Date of Patent: *Jul. 20, 2010

(54) MULTIJUNCTION SOLAR CELL WITH A BYPASS DIODE HAVING AN INTRINSIC LAYER

(75) Inventors: Paul R. Sharps, Albuquerque, NM (US); Daniel J. Aiken, Cedar Crest, NM (US); Doug Collins, Albuquerque, NM (US); Mark A. Stan, Albuquerque, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/773,343

(22) Filed: Feb. 6, 2004

(65) Prior Publication Data

US 2004/0163698 A1 Aug. 26, 2004

Related U.S. Application Data

(63) Continuation of application No. 10/280,593, filed on Oct. 24, 2002, now Pat. No. 6,864,414, which is a continuation-in-part of application No. 09/999,598, filed on Oct. 24, 2001, now Pat. No. 6,680,432.

(51) Int. Cl.
*H01L 31/00* (2006.01)
(52) U.S. Cl. .................... 136/255; 136/256
(58) Field of Classification Search .............. 136/255, 136/249, 261, 262, 256; 257/458, 431, 461, 257/443, 453, 466; 438/74, 81, 93, 98
See application file for complete search history.

(56) References Cited

U.S. PATENT DOCUMENTS

| | | | |
|---|---|---|---|
| 4,083,063 A * | 4/1978 | Yu ............................. 257/161 |
| 4,245,386 A | 1/1981 | Kausche et al. |
| 4,598,164 A | 7/1986 | Tiedje et al. |
| 4,759,803 A | 7/1988 | Cohen |
| 5,009,720 A | 4/1991 | Hokuyo et al. |
| 5,138,403 A | 8/1992 | Spitzer |
| 5,155,565 A | 10/1992 | Wenz et al. |
| 6,054,716 A | 4/2000 | Sonobe et al. |
| 6,103,970 A | 8/2000 | Kilmer et al. |
| 6,184,458 B1 | 2/2001 | Murakami et al. |
| 6,248,948 B1 | 6/2001 | Nakagawa et al. |
| 6,278,054 B1 * | 8/2001 | Ho et al. ..................... 136/256 |
| 6,300,558 B1 | 10/2001 | Takamoto et al. |
| 6,316,716 B1 | 11/2001 | Hilgrath |
| 6,359,210 B2 * | 3/2002 | Ho et al. ..................... 136/256 |
| 6,452,086 B1 * | 9/2002 | Muller ........................ 136/244 |

(Continued)

FOREIGN PATENT DOCUMENTS

EP 1 056 137 A1 11/2000

(Continued)

*Primary Examiner*—Jeffrey T Barton

(57) ABSTRACT

A multijunction solar cell including first and second solar cells on a substrate with an integral bypass diode having an intrinsic layer and operative for passing current when the multijunction solar cell is shaded. In one embodiment, a vertical sequence of solar cells are epitaxially grown on a first portion of the substrate, and the layers of the diode are epitaxially grown on a second portion of the substrate with the layers of the bypass diode being deposited subsequent to the layers of the top solar cell.

20 Claims, 14 Drawing Sheets

U.S. PATENT DOCUMENTS

| | | | |
|---|---|---|---|
| 6,476,313 B2 * | 11/2002 | Kawano | 136/255 |
| 6,600,100 B2 * | 7/2003 | Ho et al. | 136/255 |
| 6,635,507 B1 * | 10/2003 | Boutros et al. | 438/57 |
| 6,680,432 B2 * | 1/2004 | Sharps et al. | 136/255 |
| 6,690,041 B2 * | 2/2004 | Armstrong et al. | 257/184 |
| 6,864,414 B2 * | 3/2005 | Sharps et al. | 136/255 |
| 2002/0040727 A1 * | 4/2002 | Stan et al. | 136/255 |
| 2002/0164834 A1 * | 11/2002 | Boutros et al. | 438/59 |
| 2003/0140962 A1 * | 7/2003 | Sharps et al. | 136/249 |
| 2004/0149331 A1 * | 8/2004 | Sharps et al. | 136/255 |

FOREIGN PATENT DOCUMENTS

| | | |
|---|---|---|
| GB | 2346010 A * | 7/2000 |
| JP | S57-204180 | 12/1982 |
| JP | 60-160181 A * | 8/1985 |
| JP | H02-005575 | 1/1990 |
| JP | 02-090573 | 3/1990 |
| JP | H03-077382 | 4/1991 |
| JP | H05-048134 | 2/1993 |
| JP | 9-64397 A * | 3/1997 |
| JP | 10-200159 | 7/1998 |
| JP | 2002-517098 | 6/2002 |
| WO | WO 99/62125 A1 * | 12/1999 |
| WO | 01/06565 | 1/2001 |

* cited by examiner

900

| | | |
|---|---|---|
| Pad | 804 | |
| p-GaAs | 864 | Bypass Diode 620 |
| i-GaAs (i-layer) | 862 | |
| n-GaAs | 860 | |
| Stop Etch Layer | 612 | |
| Lateral Conduction Layer | 610 | |
| Cap Layer | 850 | |
| Window | 846 | 608 |
| Emitter | 844 | |
| Base | 842 | |
| BSF | 840 | |
| P++/n++ tunneling junction | 830 | |
| Window | 826 | 606 |
| Emitter | 824 | |
| Base | 822 | |
| BSF | 820 | |
| P++/n++ tunneling junction | 816 | |
| Nucleation layer | 814 | 604 |
| Emitter | 812 | |
| Base | 810 | |
| Substrate | 602 | |
| Contact | 802 | |

FIG. 9A

MULTIJUNCTION SOLAR CELL WITH A BYPASS DIODE HAVING AN INTRINSIC LAYER

This application is a continuation application of U.S. application Ser. No. 10/280,593, filed on Oct. 24, 2002, which issued as U.S. Pat. No. 6,864,414, on Mar. 8, 2005, which is a continuation-in-part of application Ser. No. 09/999,598, filed on Oct. 24, 2001, which issued as U.S. Pat No. 6,680,432 on Jan. 20, 2004.

This application is also related to co-pending U.S. patent application Ser. No. 10/732,456, filed Nov. 26, 2003, which is a continuation application of U.S. application Ser. No. 09/999,598, filed Oct. 24, 2001, now U.S. Pat. No. 6,680,432.

This application is also related to co-pending U.S. patent application Ser. No. 10/336,247 filed Jan. 3, 2003, which is a continuation application of U.S. patent application Ser. No. 09/934,221, filed on Aug. 21, 2001, now U.S. Pat. No. 6,600,100, which is a division of U.S. patent application Ser. No. 09/314,597, filed on May 19, 1999, now U.S. Pat. No. 6,278,054, which claims priority from U.S. Provisional Patent Application Ser. No. 60/087,206, filed on May 28, 1998. U.S. application Ser. No. 09/753,492, filed Jan. 2, 2001, now U.S. Pat. No. 6,359,210, is also a division of Ser. No. 09/314,597.

FIELD OF THE INVENTION

The present invention relates to the field of semiconductor devices. More specifically, the present invention relates to the photovoltaic solar cells.

DESCRIPTION OF THE RELATED ART

Photovoltaic cells, also called solar cells, are one of the most important new energy sources that have become available in the past several years. Considerable effort has gone into solar cell development. As a result, solar cells are currently being used in a number of commercial and consumer-oriented applications. While significant progress has been made in this area, the requirement for solar cells to meet the needs of more sophisticated applications has not kept pace with demand. Applications such as satellites used in mobile and telephone communications have dramatically increased the demand for solar cells with improved power and energy conversion characteristics.

In satellite and other space related applications, the size, mass, and cost of a satellite power system are dependent on the power and energy conversion efficiency of the solar cells used. Putting it another way, the size of the payload and the availability of on-board services are proportional to the amount of power provided. Thus, as the payloads become more sophisticated, solar cells, which act as the power conversion devices for the on-board power systems, become increasingly more important.

Solar cells are often used in arrays, an assembly of solar cells connected together in a series. The shape and structure of an array, as well as the number of cells it contains; are determined in part by the desired output voltage and current.

When solar cells in an array are receiving sunlight or are illuminated, each cell will be forward biased. However, if any of the cells are not illuminated, because of shadowing or damage, those shadowed cells may be forced to become reversed biased in order to carry the current generated by the illuminated cells. This reverse biasing can degrade the cells and can ultimately render the cells inoperable. In order to prevent reverse biasing, a diode structure is often implemented.

The purpose of the bypass diode is to draw the current away from the shadowed or damaged cell. The bypass becomes forward biased when the shadowed cell becomes reverse biased. Rather than forcing current through the shadowed cell, the diode draws the current away from the shadowed cell and maintains the connection to the next cell.

A conventional bypass diode is typically connected to the exterior of a solar cell array. A problem associated with this type of bypass diode is that it is difficult to manufacture and also less reliable because the exterior assembly is performed by the array assemblers rather than the cell manufacturer.

Another conventional method for protecting the solar cell is to place a bypass diode between adjacent cells wherein the anode of the bypass diode is connected to one cell and the cathode of the diode is connected to an adjoining cell. However, a problem associated with this technique is that it complicates the manufacturing process and is more difficult to assemble the solar cell array.

A third technique for protecting the solar cell involves forming a recess on the solar cell structure and placing a bypass diode in the recess. Because of the fragility of the cells this technique is difficult to implement in a manufacturing line. In addition, the adjoining cells need to be connected to the diode by the array assembler.

Thus, what is needed is a mechanism and method to enhance the efficiency and performance of bypass diodes in multijunction solar cell structures.

SUMMARY OF THE INVENTION

A solar device having a multijunction solar cell structure with a bypass diode is disclosed. The bypass diode provides a reverse bias protection for the multijunction solar cell structure. In one embodiment, the multijunction solar cell structure includes a substrate, a bottom cell, a middle cell, a top cell, a bypass diode, a lateral conduction layer, and a shunt. The lateral conduction layer is deposited over the top cell. The bypass diode is deposited over the lateral conduction layer. One side of the shunt is connected to the substrate and another side of the shunt is connected to the lateral conduction layer. In another embodiment, the bypass diode contains an i-layer to enhance the diode performance.

Additional features and benefits of the present invention will become apparent from the detailed description, figures and claims set forth below.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 9A-9E are block diagrams illustrating a process of manufacturing a multijunction solar cell structure with a bypass diode and a shunt in accordance with one embodiment of the present invention.

DETAILED DESCRIPTION

A method and an apparatus of solar cell with multijunction solar cell structure having a bypass diode with an i-layer are described.

In the following description, for purposes of explanation, numerous specific details are set forth to provide a thorough understanding of the present invention. It will be apparent, however, to one skilled in the art that these specific details may not be required to practice the present invention. In other instances, well-known circuits and devices are shown in block diagram form to avoid obscuring the present invention.

It is understood that the present invention may contain transistor circuits that are readily manufacturable using well-known CMOS ("complementary metal-oxide semiconductor) technology, or other semiconductor manufacturing processes. In addition, the present invention may be implemented with other manufacturing processes for making digital devices.

The present invention relates to a multijunction solar cell with at least one integral monolithic bypass diode. The layers comprising the solar cell are particularly chosen for their combination of efficiency and manufacturability. As discussed below, one embodiment consists of a multijunction structure with at least three junctions, with a unique modified buffer structure.

The process of manufacturing the solar cell with an integral monolithic bypass diode is comprised of five distinct steps, which are described below.

Figure 1:
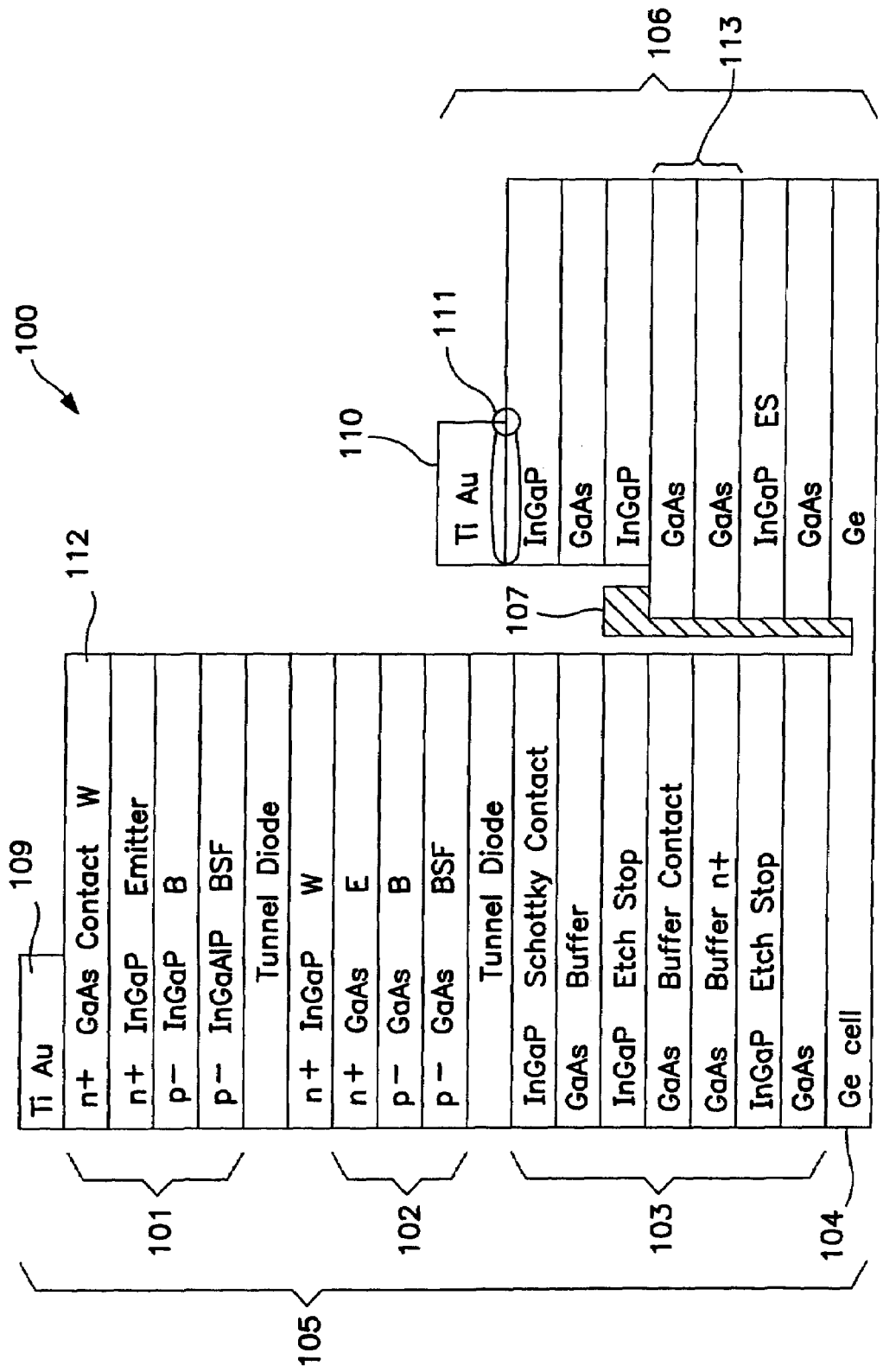
FIG. 1 illustrates one embodiment of the present invention, a multijunction solar cell, after the completion of all processing steps, illustrating the composition of such embodiment.
Figure 2:
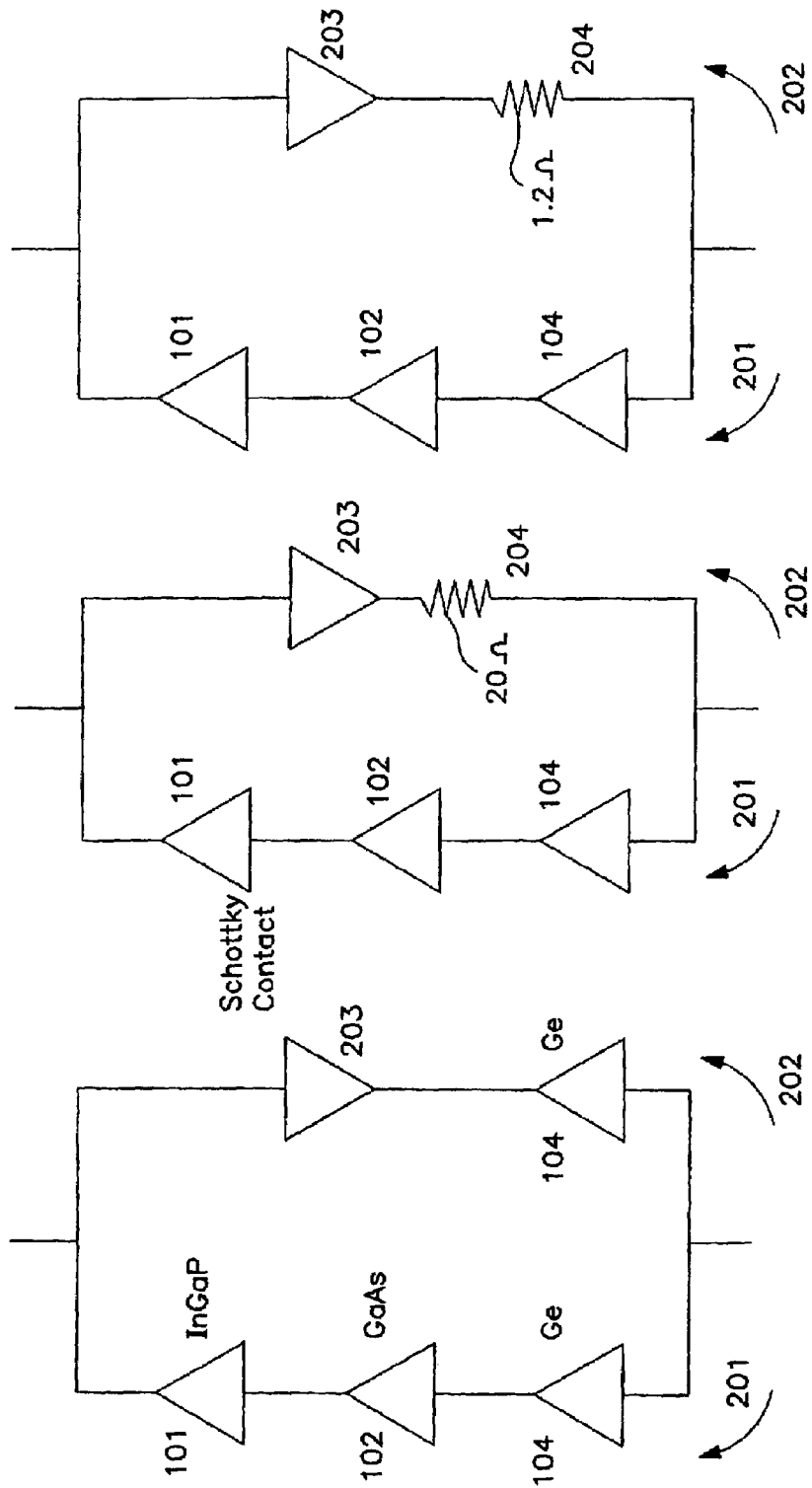
FIG. 2 illustrates the two paths current in the cell illustrated in FIG. 1 can take, given a particular set of circumstances.

FIG. 1 is an illustration of an embodiment of the invention, a monolithic solar cell with an integral bypass diode. FIG. 2 is a series of schematic drawings of the two possible current paths through the cell.

Figure 4:
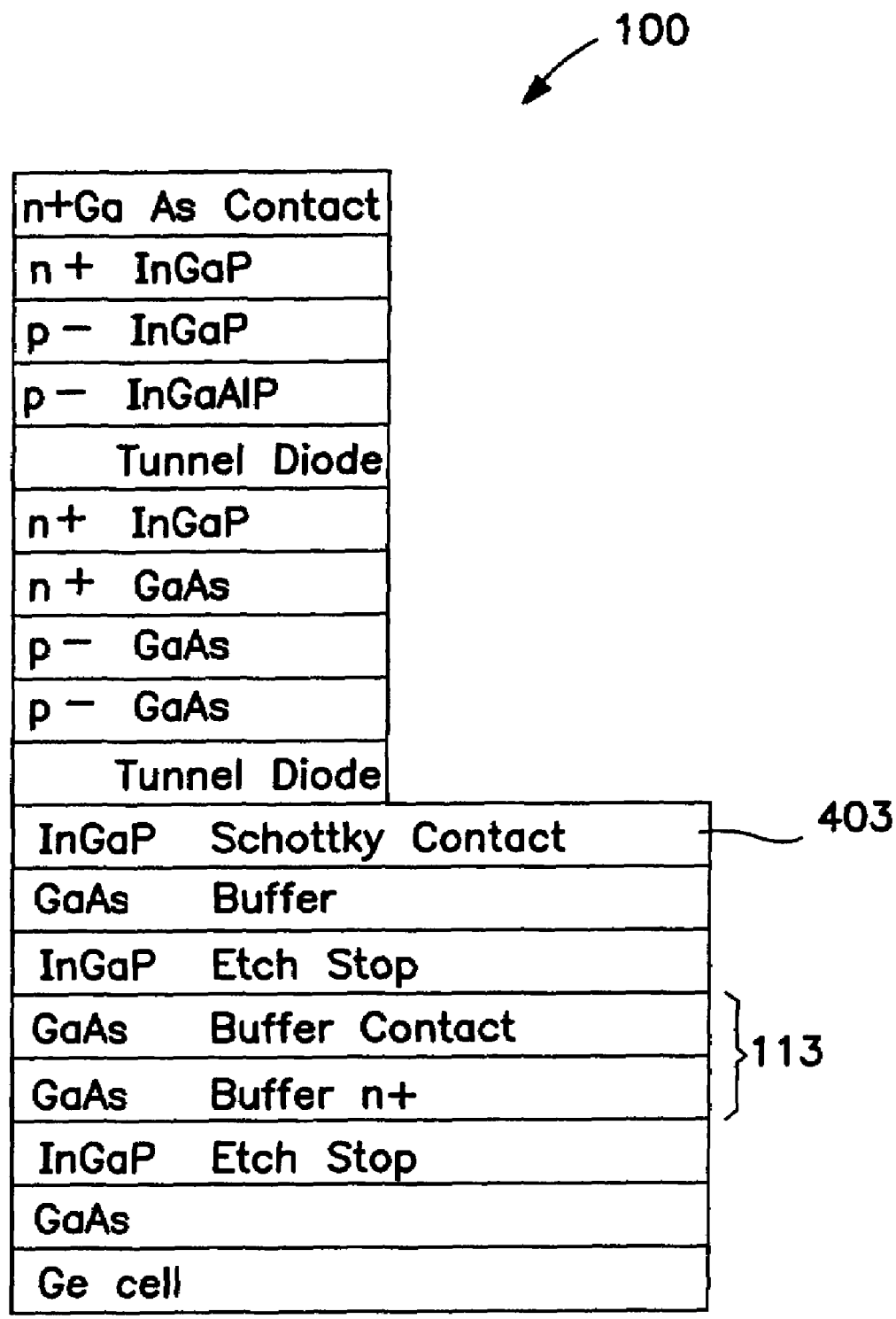
FIG. 4 illustrates a first processing step used to construct one embodiment of the present invention.

FIG. 1 shows a multijunction solar cell 100 with a cell of Indium Gallium Phosphorus (InGaP) 101 and a cell of Gallium Arsenide (GaAs) 102 over a GaAs buffer 103 on top of a Germanium (Ge) substrate 104. When the solar cell 100 is illuminated, both a voltage and a current are generated. FIG. 2A represents the solar cell as seen in FIG. 4, without the metallization 107 and lateral conduction layer 113 described below. If the solar cell is illuminated, there will be no barrier to the current following the cell path 201 through the layers of the solar cell: the Ge junction 104, the GaAs junction 102, and the InGaP junction 101.

However, when the solar cell 100 is not receiving sunlight, whether because of shading by a movement of the satellite, or as a result of damage to the cell, then resistance exists along the cell path 201. As solar cells exist in an array, current from illuminated cells must pass through shaded cells. If there were no diode, the current would force its way through the cell path 201, reversing the bias of such cells and degrading, if not destroying them.

If the cell contains a diode, however, the current can be offered an alternate, parallel path 202, and the shaded cells will be preserved. The problem with this concept has been the difficulty in creating a diode that is relatively easy to manufacture and which uses a very low level of voltage to turn on and operate. The invention described herein solves these problems.

If a cell is shaded or otherwise not receiving sunlight, in order for the current to choose the diode path 202, the turn on voltage for the diode path 202 must be less than the breakdown voltage along the cell path 201. The breakdown voltage along the cell path will typically be at least five volts, if not more. The Schottky junction 111 requires a relatively small amount of voltage to "turn on"—600 millivolts. However, to pass through the Ge junction 104, the bias of the Ge junction 104 must be reversed, requiring a large voltage. Reversing the bias of the Ge junction 104 requires approximately 9.4 volts, so nearly ten volts are needed for the current to follow the diode path 202 in FIG. 2A. Ten volts used to reverse the bias of the Ge junction is ten volts less than otherwise would be available for other applications. The device illustrated by FIG. 4 is therefore a functioning bypass diode, but an inefficient one from a power utilization perspective.

To address this inefficiency, in the metallization process in which the Titanium Gold (TiAu) contacts 109, 110 are added to the solar cell, an additional layer of metal 107 is added as well. In the embodiment shown in FIG. 1, the metal is TiAu, although practitioners in the art will be well aware that other metals can also be used.

The effect of the metal 107 is to "short" the Ge junction 104 to the base of the Ge cell 104. Because of the short, a minimal voltage is required to pass current between the layer 113 and the Ge substrate. No longer is a high voltage required to force the current through the Ge junction 104. The current flows easily through the "short path" 107. FIG. 2B provides a schematic representation. If the solar cell is shaded, no longer is the cell forced into reverse bias to pass the current of the array string. There is a much less resistive path, requiring a much lower voltage drop, for the current to pass through the bypass diode 203. With the addition of the metalization 107, the Ge cell 104 is shorted. As a result, rather than a reverse biased diode with a 9.4 turn-on voltage, the current instead encounters an ohmic resistance path represented by the resistor 204.

The layer is doped to about 7 to 8 times $10^{17}$ cm$^3$ to do two things. First, it reduces the contact resistance of the metal layer 107 and second, it provides a low resistance path for the lateral conduction layer. Without the lateral conduction layer, the resistance at the resistor 204 is approximately 20 ohms. 20 ohms represents a significant drain on the current of the solar cell. To reduce this resistance, a lateral conduction layer 113 is added to the solar cell. FIG. 2C represents the current paths in the solar cell as depicted in FIG. 1. When the solar cell is shaded, the current will flow to the resistor 204. Because of the presence of the lateral conduction layer 113, the resistance at the resistor can be as low as 0.4 ohms.

Figure 3:
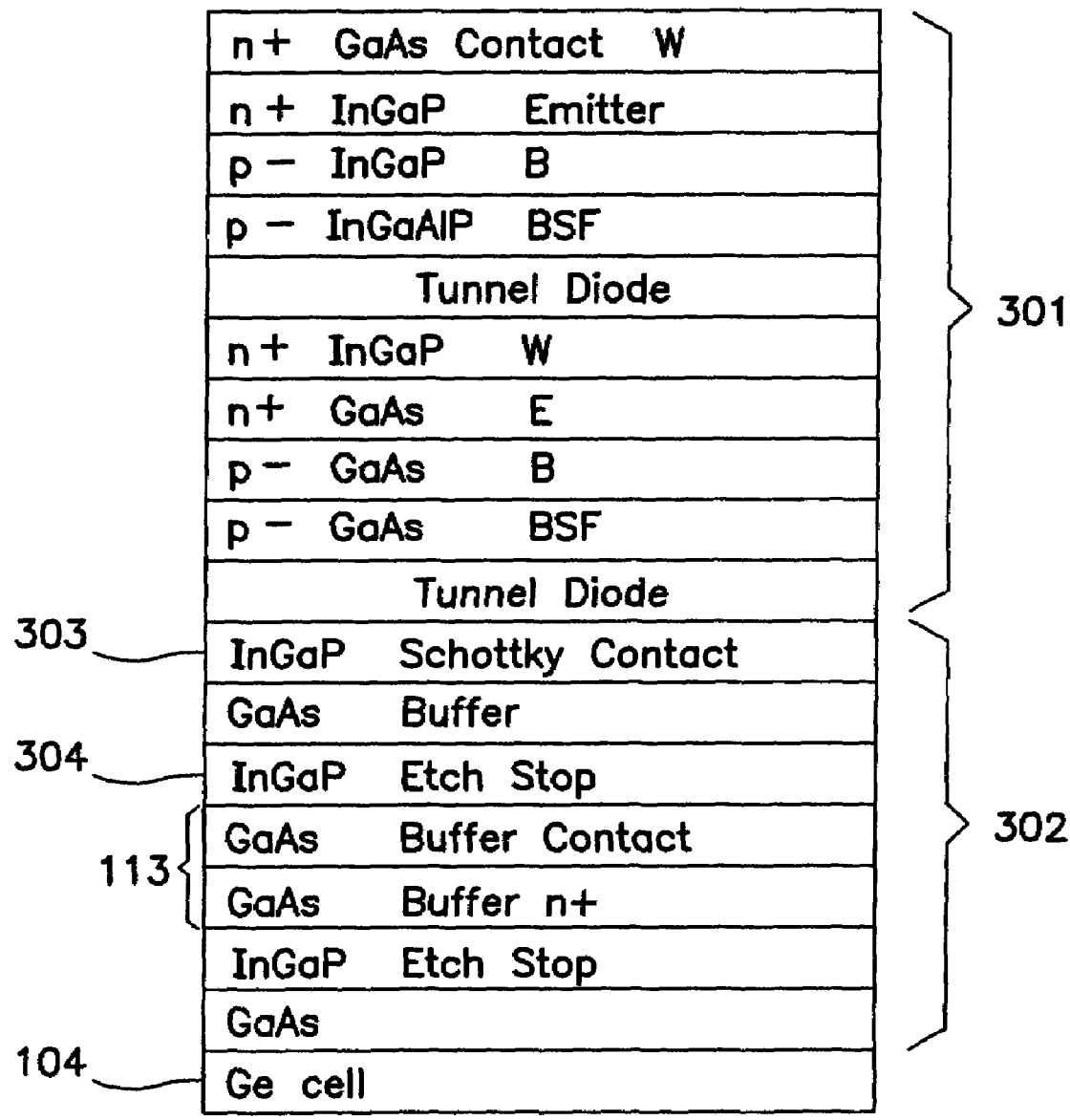
FIG. 3 illustrates one embodiment of the present invention, a multijunction solar cell, prior to any processing steps.

The manufacturing process for the solar cell 100 comprises five steps. FIG. 3 shows a multijunction solar cell 100 and the component parts: the multijunction structure 301 and the buffer structure 302. In the illustrated embodiment, a top cell comprised of an n-on-p InGaP$_2$ 101 is grown over a cell of n-on-p GaAs 102. A third diffused Ge junction 104 is formed due to diffusion of As during the growth of buffer layers 103.

A buffer exists between the upper junctions in the solar cell and the Ge substrate 104, because the upper junctions are fabricated of III-V material, and the entire cell is grown on a Ge substrate 104. Ge is a group IV element, so it has different lattice parameters than group III-V elements. Lattice matching is generally accepted among those skilled in the art as a way to increase the efficiency of a solar cell, and it follows that lattice mismatching decreases a cell's overall efficiency. To achieve lattice matching, the buffer layer is inserted in the manufacture process; normally it is a thick layer of GaAs grown over the Ge substrate. An InGaP layer lattice matches with a GaAs layer much better than with a Ge layer.

The buffer structure 302 is comprised of the following: an InGaP Schottky contact 303 as the top layer of the buffer structure 302. This will later form the Schottky diode. The buffer structure 302 is also comprised of an additional etch stop 304. The etch stop 304 enables the device to be more easily manufactured. Upon "wet etching" the etch stop creates barriers during processing which facilitate formation of the bypass diode. The lateral conduction layer 113 exists in this buffer layer, to more efficiently guide the current out of the diode, as discussed above.

As shown on FIG. 4, the first step in the manufacturing process is to make a "wet etch" that comes down into the cell 100 and terminates at the InGaP layer 403.

A TiAu contact 110 is formed upon the InGaP layer 403. A TiAu contact 109 is formed at the top of the cell to make an ohmic contact with the n$^+$-GaAs layer 112. The TiAu contact 110 on the InGaP layer 403 makes a Schottky contact, which is non-ohmic. In other words, instead of looking like a resistor, such contact 403 and the TiAu contact 110 forms a diode.

Figure 5:
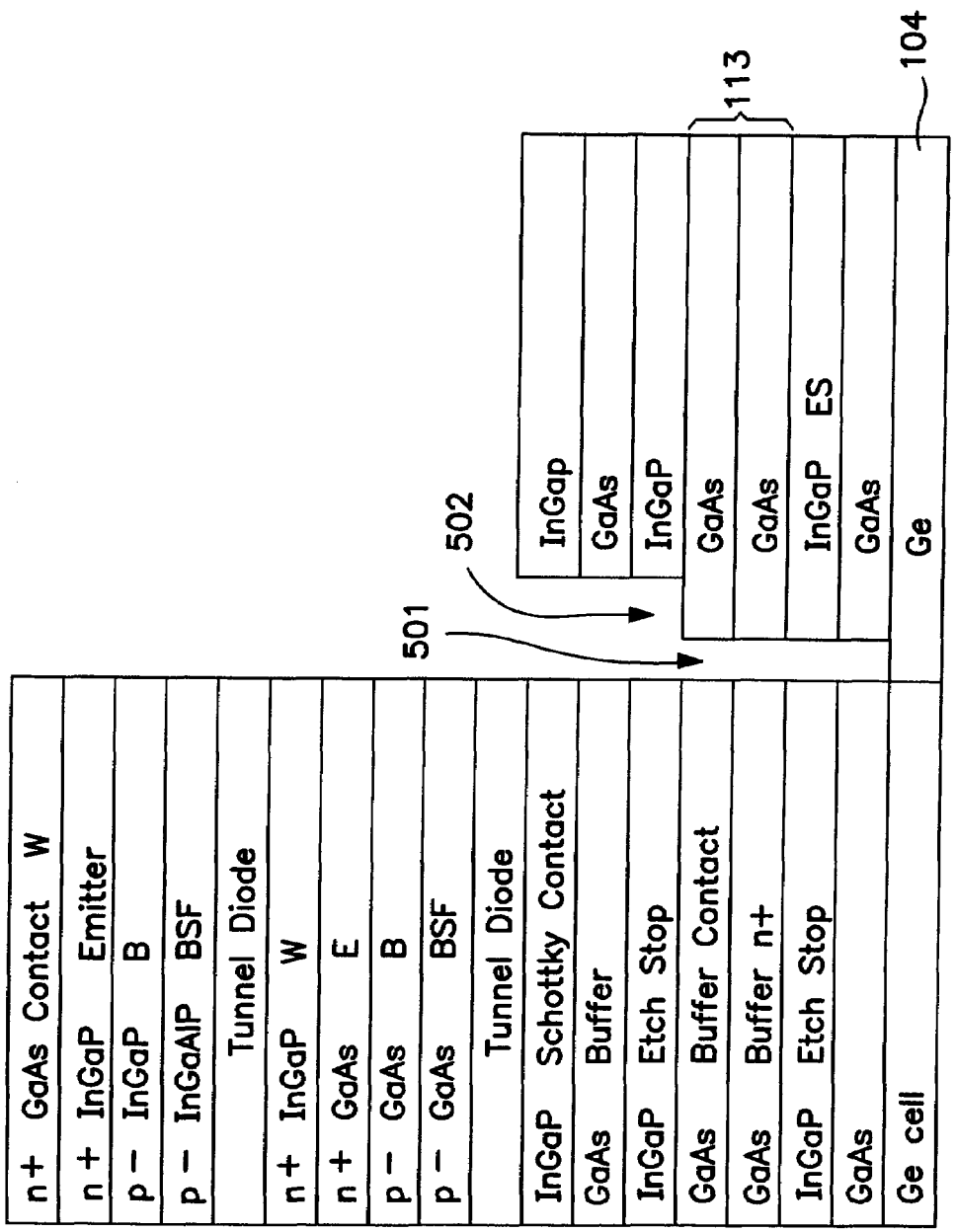
FIG. 5 illustrates the second and third processing steps used to construct one embodiment of the present invention.

The second step in the manufacturing process is demonstrated in FIG. 5. FIG. 5 shows a "mesa etch" 501 down to the level of the Ge cell 104. The primary purpose of this step is to create a true diode 106, electrically isolating the junctions 105 within the solar cell from the diode 106. When the entire solar cell is manufactured and the metal contacts are bound and the cell is packaged, the cell 105 and the diode 106 will be parallel, yet electrically separate.

The third step is a "shunt etch" 502, which provides a "shelf" on which the metal 107 in the next step will be laid. To make etches in the middle of manufacturing without etch stops among the layers, one would have to use a "minute etch" which would be extremely difficult to use with any degree of precision in this instance. The etch stop 304 allows the solar cell to be manufactured more efficiently.

The fourth step is the metalization process. The TiAu contacts 109, 110 are added, and the metal layer 107 is added. In this embodiment the metal comprising the layer is TiAu. Where the TiAu contact 110 meets the InGaP layer 403, a Schottky contact is created.

At the TiAu contact 109 on top of the cell, the TiAu makes an ohmic contact to n-type GaAs 112. That is an ordinary cell conduction for this type of cell to persons skilled in the art. With the TiAu contact 110 at the InGaP layer 403, a Schottky contact is created. However, because the object is to "short out" the Ge cell 104, the contact was made to the highly doped n+-GaAs cell 113. Layer 113 is also a lateral conduction layer. Upon making the contact to the GaAs layer 113, a resistor is created. The resistance at the resistor 204 was approximately 20 ohms, as illustrated in FIG. 2A. 20 ohms of power dissipation can make the cell too inefficient from a power utilization perspective.

The etch stop at the GaAs buffer contact 304 alleviates this problem. The GaAs buffer contact 113 is n$^+$ doped at the same level as the GaAs buffer contact 112 at the top of the cell. This creates a cell with the same quality of contact between the TiAu contact 109 and the GaAs contact layer 112 at the top of the cell as the metal contact 107 with the GaAs layer 113.

Modifying the thicknesses of the various layers in the diode 106 is another way to decrease resistance in the diode 106.

The lateral conduction layer 113 also alleviates the resistance through the diode 106, from 20 ohms to as low as 0.4 ohms. The current path passes through the diode 106, and the thickness of the diode would ordinarily cause some resistance, but the lateral conduction layer 113 helps the current move to the metal more efficiently. In this embodiment, the lateral conduction layer is made of highly doped n$^+$-GaAs. The shunt layer 107 can also be made to partially or completely surround the contact 110, further lowering the series resistance.

The lateral conduction layer 113 and the metalization 107 are the two most important means to lessen the amount of voltage needed to "turn on" the diode and bypass the shaded cell. By reducing the series resistance, the amount of localized I$^2$R heating is also reduced. The process is also unique because the amount of processing steps are reduced, as the bypass diode layers are grown internally to the buffer layers of the cell, rather than as additional layers that have to be grown on top of the cell. The current device provides for a low bypass diode turn on, as well as a low series resistance bypass diode. Completion of the bypass diode circuit requires a soldered or welded interconnect made between contacts 109 and 110. This can be done as part of the usual interconnect weld.

The fifth step in the manufacturing process is to apply the anti-reflective coating and include etches where external contacts will be attached.

As can be seen from the foregoing, the process by which the diode is manufactured is integral to the manufacture of the cell, and does not require additional manufacturing steps or additional layers to be grown on the cell.

The following illustrates another embodiment of the present invention in which a bypass diode is epitaxially disposed over a multijunction solar cell with an i-layer.

Figure 6:
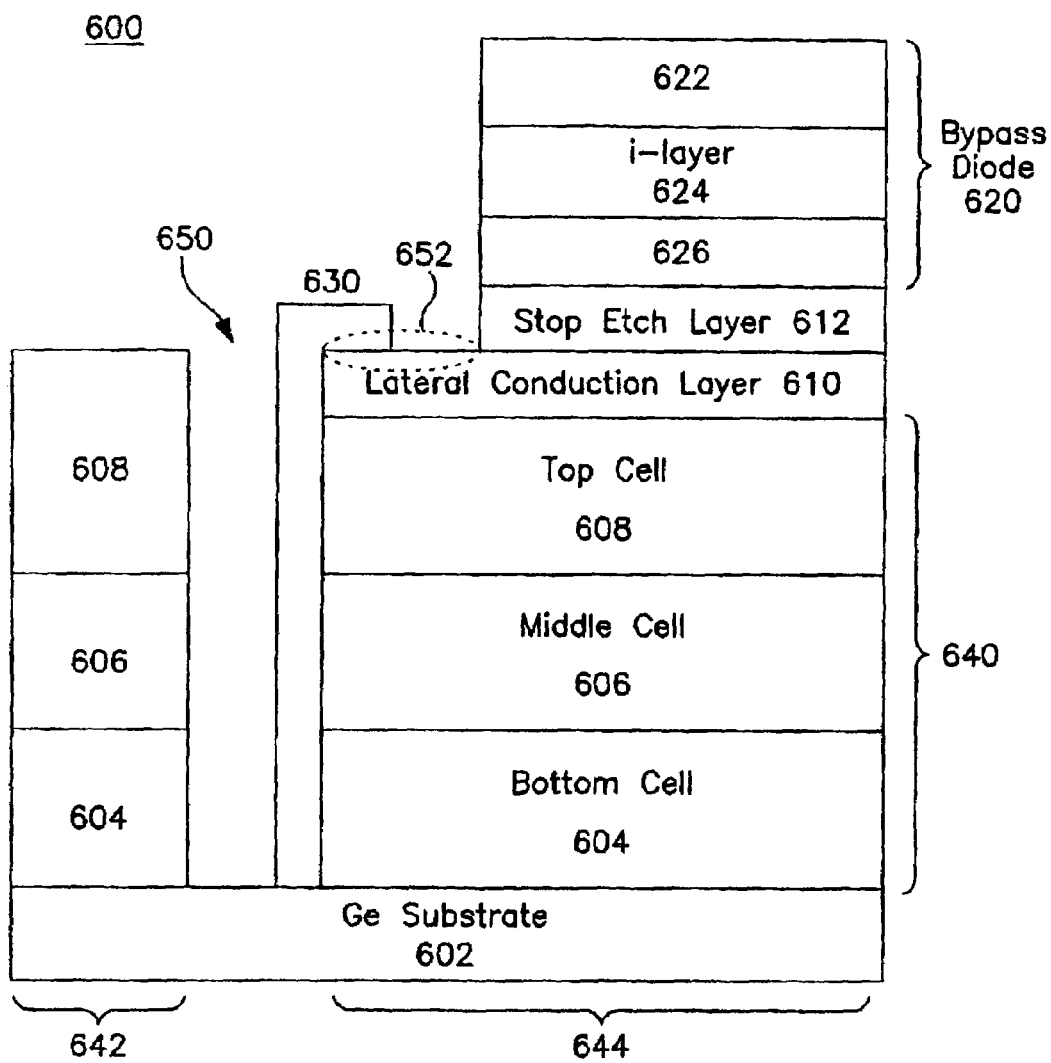
FIG. 6 is a block diagram illustrating a schematic sectional view showing a multijunction solar cell structure having a bypass diode in accordance with one embodiment of the present invention.

FIG. 6 is a block diagram 600 illustrating a schematic sectional view showing a multijunction solar cell structure 640 having a bypass diode 620 in accordance with one embodiment of the present invention. Diagram 600 includes a substrate 602, a multijunction solar cell structure 640, a bypass diode 620, a well 650, and a shunt 630. In one embodiment, the substrate 602 is a germanium substrate. The multijunction solar cell structure 640 further includes a top, middle, and bottom subcells. It should be noted that terms solar cells, cells, and subcells will be used interchangeably herein. The multijunction solar cell structure is divided into two portions 642-644, wherein portion 642 includes solar cell(s) for converting solar power to electrical power and portion 644 contains a bypass diode 620.

Referring to FIG. 6, the multijunction solar cell structure 640 is a multijunction solar cell structure wherein a bottom solar cell 604 is deposited over the substrate and a middle solar cell 606 is deposited over the bottom solar cell 604. The top solar cell 608 of the multijunction solar cell structure is deposited over the middle solar cell 606. Each solar cell within the multijunction solar cell structure is designed to convert the solar energy within a range of wavelength λ of the solar spectrum. For example, the top solar cell 608 of the multijunction solar cell structure is designed to convert the high frequency portion of the solar spectrum into electrical energy. The high frequency portion may include ultraviolet, X-rays, and/or Gamma rays of the solar spectrum. In one embodiment, the high frequency portion covers λ in a range of approximately 700 nm to 100 nm. The middle solar cell 606 is responsible for converting the solar energy in a range of ultraviolet, visible light, and/or portions of infrared of the solar spectrum, which may be approximately between 90 nm to 1000 nm. The bottom solar cell 604 is responsible for converting the solar energy in a range of infrared, microwaves, and/or radio waves, which may be approximately between 700 nm and/or greater.

It is known to one skilled in the art that the solar spectrum could be divided into more than three regions and each region has an associated solar cell for capturing photons within the respected region. It should be further noted that the underlying concept of the present invention applies to multijunction solar cell structure 640 containing more or less than three subcells.

Diagram 600 further includes a lateral conduction layer 610 and a stop etch layer 612. For one embodiment, the lateral conduction layer 610 is heavily doped so that it has the property of high electrical conductivity. The stop etch layer 612, in one aspect, is needed to create a shunt contact pad 652 during the etching process.

Referring to FIG. 6, the bypass diode 620 includes an n-type layer 626, i-type layer 624, and p-type layer 622. For example, n-type layer 626 could be an n-doped gallium arsenic ("GaAs") layer and a p-type layer 622 could be a p-doped GaAs layer. In one embodiment, a bypass diode with p-on-n polarity is formed when a p-type compound layer is deposited over an n-type compound layer. In another embodiment, a bypass diode with n-on-p polarity may be formed when an n-type compound layer is deposited over a p-type compound layer. The i-type layer 624 is also referred to as an intrinsic layer, lightly doped layer, i-layer and/or non-doping layer. It should be noted that terms i-type layer, intrinsic layer, lightly doped layer, i-layer and undoped layer are interchangeable herein. A function of i-layer 624 is to reduce defect breakdown such as microplasma breakdown. In other words, i-layer 624 reduces leakage current when the bypass diode 620 is in reverse bias mode. As discussed above, the bypass diode 620 preserves the integrity of the solar cell by preventing the solar cell from entering the reverse bias mode.

In one embodiment, the bypass diode 620 is epitaxially formed over the multijunction solar cell structure 640 so that the bypass diode 620 becomes an integral part of the solar cell structure. In other words, the bypass diode 620 is part of the monolithic solar cell structure. During the manufacturing process, for instance, once an n-type layer 626 is deposited over the stop etch layer 612, an i-type layer 624 is deposited over the n-type layer 626. A bypass diode is completed after a p-type layer 622 is deposited over the i-type layer 624. An advantage of an integral bypass diode 620 is to allow the bypass diode to be manufactured at the same time the multijunction solar cell structure 640 is manufactured. The bypass diode 620 is electrically isolated from the active portion of the solar cell by well 650.

Well 650, in one embodiment, is created by an etch process, such as a mesa etch. This generates a physical space or gap between the solar cell and the bypass diode 620. In other words, well 650 provides an electrical separation between the active portion of the solar cell and the bypass diode 620. Well 650 also provides a path allowing a shunt 630 to access the substrate. In one embodiment, once shunt 630 is deposited, well 650 may be filled with non-conductive materials, such as anti-reflective materials. It should be noted that the width of the gap or space created by the well 650 between the active portion of the solar cell and bypass diode depends on the semiconductor technology.

Shunt 630 is deposited via well 650 wherein one side of the shunt 630 is in contact with the substrate and another side of the shunt 630 is in contact with the lateral conduction layer 610. In one embodiment, one side of the shunt 630 is also in contact with a portion of the multijunction solar cell structure 640, which contains the bypass diode 620. In other words, the shunt 630, in this embodiment, shorts a portion of the multijunction solar cell structure that is underneath the bypass diode 620. In this embodiment, the shunt 630 is made of metal to enable it to pass electric current from the substrate to the bypass diode 620 with minimal current loss. An advantage of using shunt 630 is that it reduces the need for external welding jumpers or shorts, which affect the reliability of the solar cell.

Figure 7:
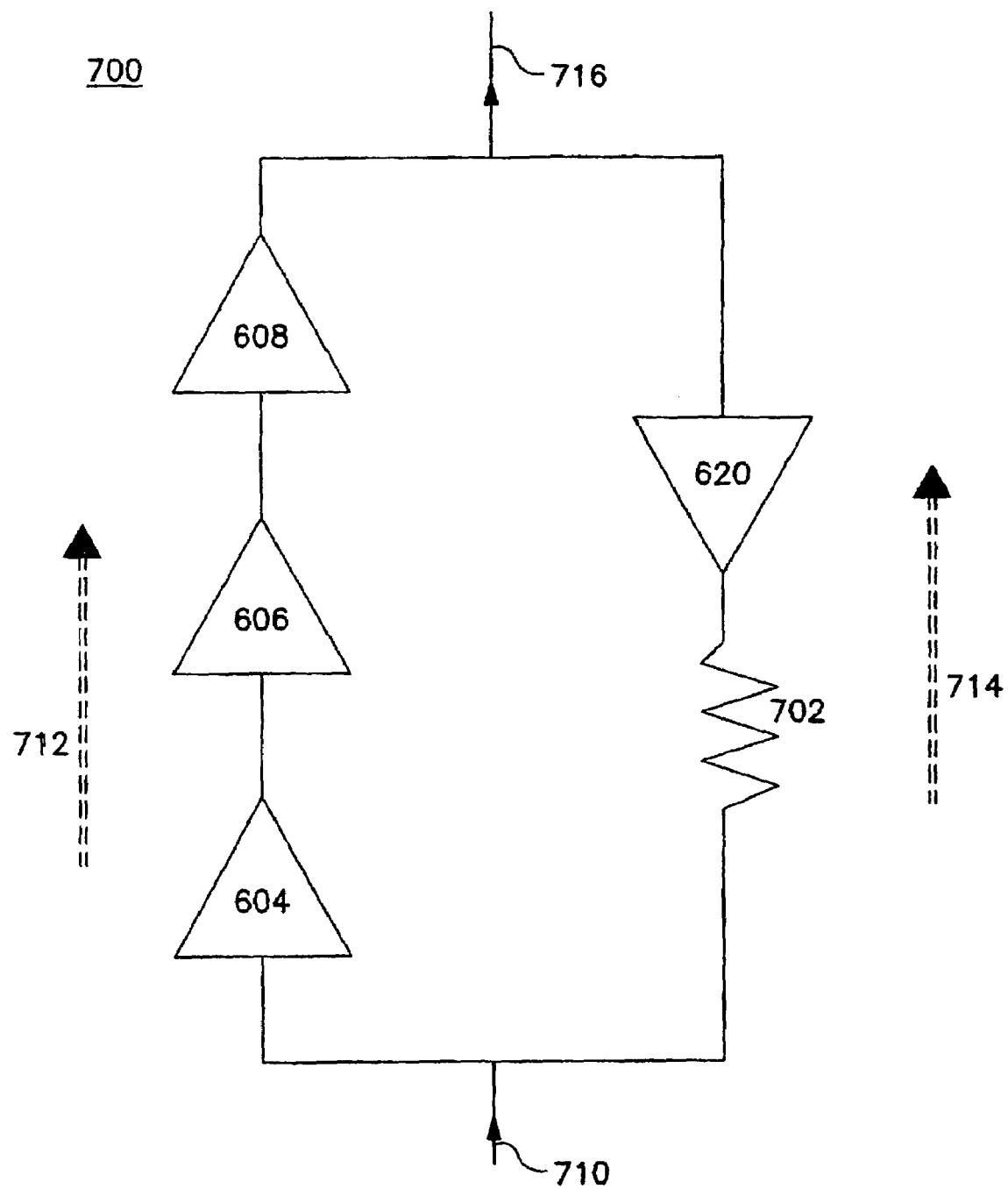
FIG. 7 is a logic diagram illustrating a triple junction solar cell structure and a bypass diode in accordance with one embodiment of the present invention.

FIG. 7 is a logic diagram 700 illustrating a triple junction solar cell structure and a bypass diode 620 in accordance with one embodiment of the present invention. The logic diagram 700 includes a top cell 608, a middle cell 606, a bottom cell 604, a bypass diode 620, a resistance block 702, and four paths 710-716. In one embodiment, the resistance block 702 includes resistance from the shorted portion of the multijunction solar cell structure that is situated underneath of the bypass diode 620 and the resistance from the shunt 630.

During normal approach (e.g., solar cells 604-608 are exposed to sunlight, solar light, light, radiation, and/or photons), the solar cells 604-608 are in forward biased. They converts solar energy to electrical energy and pass electric current between the neighboring solar cells connected in series. It should be noted that the terms sunlight, solar light, light, radiation, and/or photons may be used interchangeable herein. In this embodiment, solar cells are organized in a series. While solar cells 604-608 are in forward biased, bypass diode 620 is reverse biased because bypass diode 620 has an opposite polarity from solar cells. Thus, when bypass diode 620 is in reverse bias mode, no electric current passes through the bypass diode 620.

When electrical current generated from the neighboring solar cells arrives at solar cells 604-608 via path 710, solar cells 604-608 pass total electrical current, which includes the current converted by solar cells 604-608 and the current arriving from neighboring solar cells through path 710, to path 716 via path 712. Path 716 may be connected to another solar cell and/or other electrical devices.

However, during the situation in which the solar cells 604-608 are in reverse bias mode when, for example, solar cells 604-608 are shadowed, the bypass diode 620 becomes forward biased. In this situation, bypass diode 620 becomes active and passes the current from neighboring solar cells via path 710 to path 716 through path 714. In other words, when the solar cells 604-608 are in reverse bias mode, the bypass diode 620 becomes forward biased and uses path 714 to pass the current from path 710 to path 716.

It is understood that the underlying concept of the present invention is applicable if additional solar cells and bypass diodes were added in the logic diagram 700.

Figure 8:
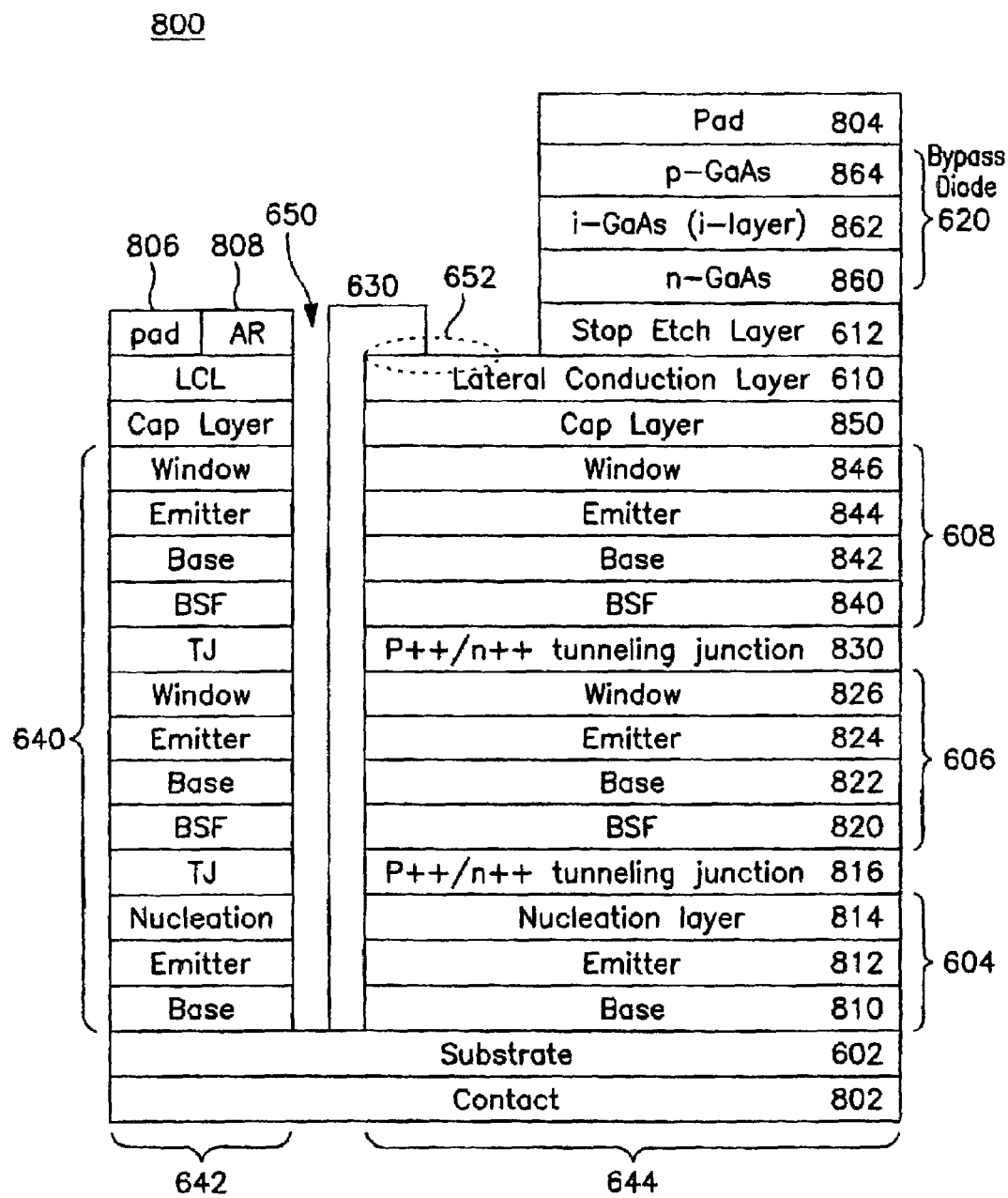
FIG. 8 is a block diagram illustrating a detailed schematic sectional view showing a triple junction solar cell structure having a bypass diode and a shunt in accordance with one embodiment of the present invention.

FIG. 8 is a block diagram 800 illustrating a detailed schematic sectional view showing a triple junction solar cell structure 640 having a bypass diode 620 in accordance with one embodiment of the present invention. Referring to FIG. 8, the block diagram 800 includes a substrate 602, a triple junction solar cell structure 640, a bypass diode 620, a well 650, and a shunt 630. The triple junction solar cell structure 640 further includes a bottom, middle, and top subcells 604-608. The block diagram 800 also includes contact pads 802-806 and anti-reflection coating 808, wherein contact pad 806 is deposited over a lateral conduction layer 610, adjacent to antireflection coating 808 and contact pad 804 is deposited over the bypass diode 620.

In one embodiment, the substrate is a p-type germanium ("Ge") substrate 602, which is formed over a metal contact pad 802. The bottom cell 604 contains a p-type Ge base layer 810, a n-type Ge emitter layer 812, and a n-type GaAs nucleation layer 814. The base layer 810 is deposited over the substrate 602. The nucleation layer 814 is deposited over the base layer 810, which in one embodiment can be formed through diffusion from an emitter layer 812. After the bottom cell 604 is deposited, a p-type and n-type tunneling junction layers 816, which are also known form a structure sometimes referred to as tunneling diode, are deposited.

The middle cell 606 further includes a back surface field ("BSF") layer 820, a p-type GaAs base layer 822, an n-type GaAs emitter layer 824, and an n-type gallium indium phosphide$_2$ ("GaInP$_2$") window layer 826. The base layer 822 is deposited over the BSF layer 820 once the BSF layer 820 is deposited over the tunneling junction layers 816. The window layer 826 is subsequently deposited on the emitter layer 824 after the emitter layer 824 is deposited on the base layer 822. The BSF layer 820 is used to reduce the recombination loss in the middle cell 606. The BSF layer 820 drives minority carriers from a highly doped region near the back surface to minimize the effect of recombination loss. In other words, a BSF layer 820 reduces recombination loss at the backside of the solar cell and thereby reduces the recombination at the emitter region.

The window layer 826 used in the middle cell 606 also operates to reduce the recombination loss. The window layer 826 also improves the passivation of the cell surface of the underlying junctions. It should be apparent to one skilled in the art that additional layer(s) may be added or deleted in block diagram 800 without departing from the scope of the present invention. Before depositing the top cell 608, p-type and n-type tunneling junction layers 830 are deposited over the middle cell 606.

The top cell 608, according to this embodiment, includes a p-type indium gallium aluminum phosphide$_2$ ("InGaAlP$_2$") BSF layer 840, a p-type GaInP$_2$ base layer 842, an n-type GaInP$_2$ emitter layer 844, and an n-type aluminum indium phosphide$_2$ ("AlInP$_2$") window layer 846. The base layer 842 is deposited on the BSF layer 840 once the BSF layer 840 is deposited over the tunneling junction layers 830. The window layer 846 is subsequently deposited on the emitter layer 844 after the emitter layer 844 is deposited on the base layer 842.

According to this embodiment, an n-type GaAs cap layer 850 is employed for enhancing better contact with metal materials. The cap layer 850 is deposited over the top cell 608. The lateral conduction layer 610, formed of n-type GaAs, is deposited over the cap layer 850. An n-type GaInP$_2$ stop etch layer is deposited over the lateral conduction layer 610. After the stop etch layer is deposited, the bypass diode is epitaxially deposited.

The bypass diode 620 includes an n-type GaAs layer 860, an i-type GaAs layer 862 layer, and a p-type GaAs layer 864. The n-type layer 860 is deposited over the stop etch layer 612. The i-type layer 862 is deposited over the n-type layer 860. The p-type layer 864 is deposited over the i-type layer 862. After layer 864 is deposited, a contact pad 804 is deposited over the bypass diode 620. Once the contact pad 804 is formed, a p-i-n bypass diode with p-on-n polarity is formed over the solar cell. In another embodiment, an n-i-p bypass with n-on-p polarity bypass diode can be also formed over a solar cell structure using similar process described above. It should be apparent to one skilled in the art that the additional layer(s) may be added or deleted in the bypass diode 620 without departing from the scope of the present invention.

In one embodiment, a metal shunt 630 is deposited via well 650. One side of the shunt 630 is connected to the substrate 602 and another side of the shunt 630 is connected to the lateral conduction layer 610 and a portion of the triple junction cell 644. An anti-reflection coating 808 may be deposited over certain parts of the solar cell to enhance solar cell performance.

It should be noted that the multijunction solar cell structure could be formed by any combination of group III to V elements listed in the periodic table, wherein the group III includes boron (B), Aluminum (Al), Gallium (Ga), Indium (In), and thallium (Ti). The group IV includes carbon (C), Silicon (Si), Ge, and Tin (Sn). The group V includes nitrogen (N), phosphorus (P), Arsenic (As), antimony (Sb), and bismuth (Bi).

Figure 9B:
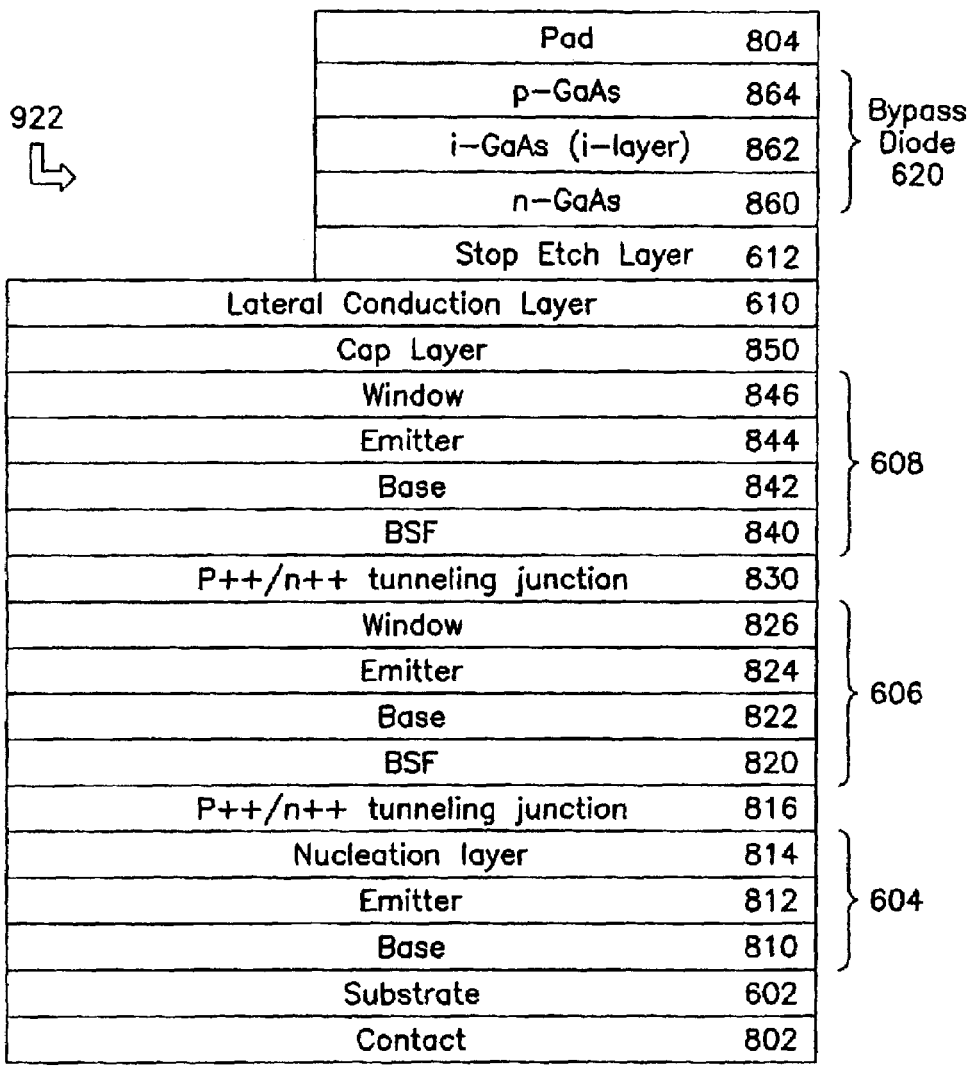

FIG. 9A-9E are block diagrams illustrating a process of manufacturing a multijunction solar cell structure 640 with a bypass diode 620 and a shunt 630 in accordance with one embodiment of the present invention. FIG. 9A illustrates a triple junction solar cell structure 900 with an integral bypass diode 602 epitaxially formed on the triple junction solar cell structure 900. The triple junction solar cell 900 includes a bottom, middle, and top cell 604-608.

Figure 9C:
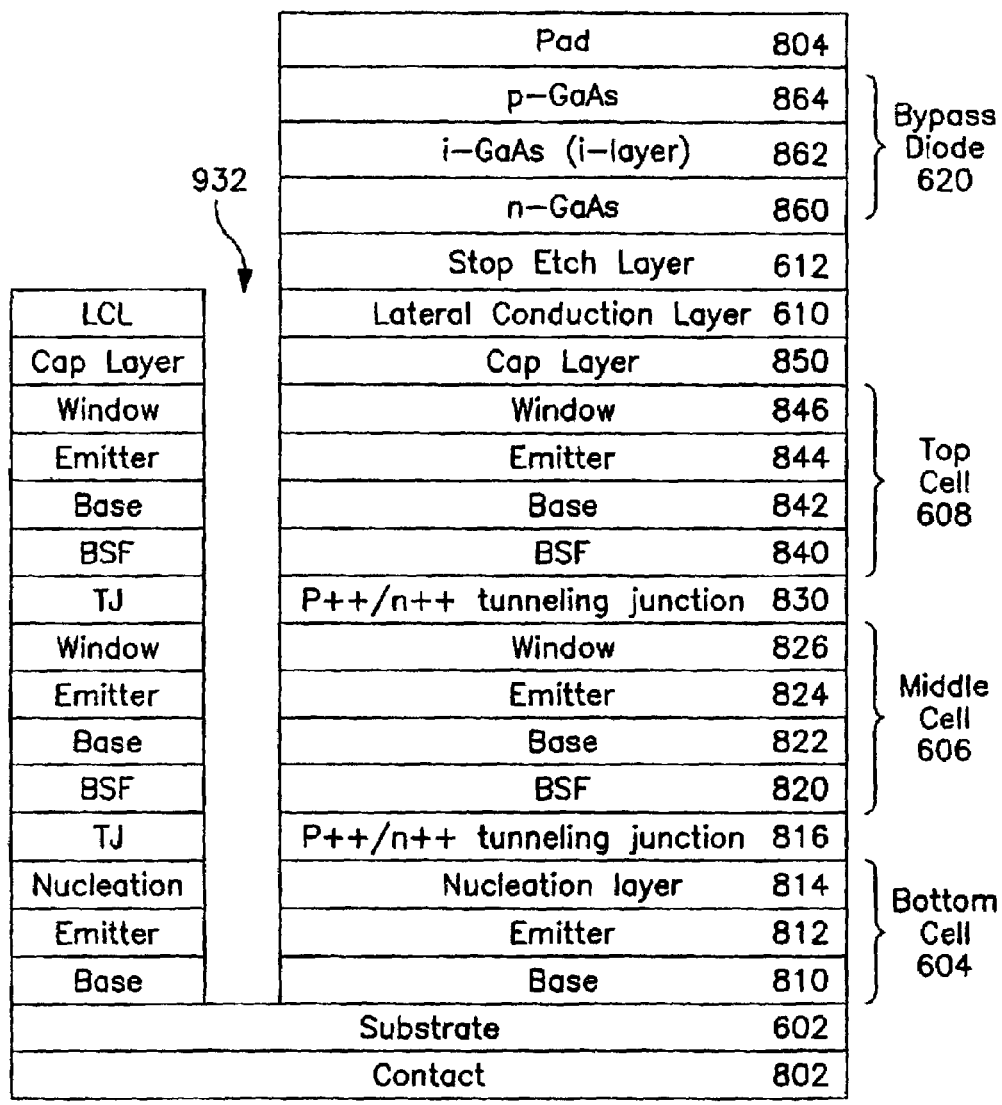
Figure 9D:
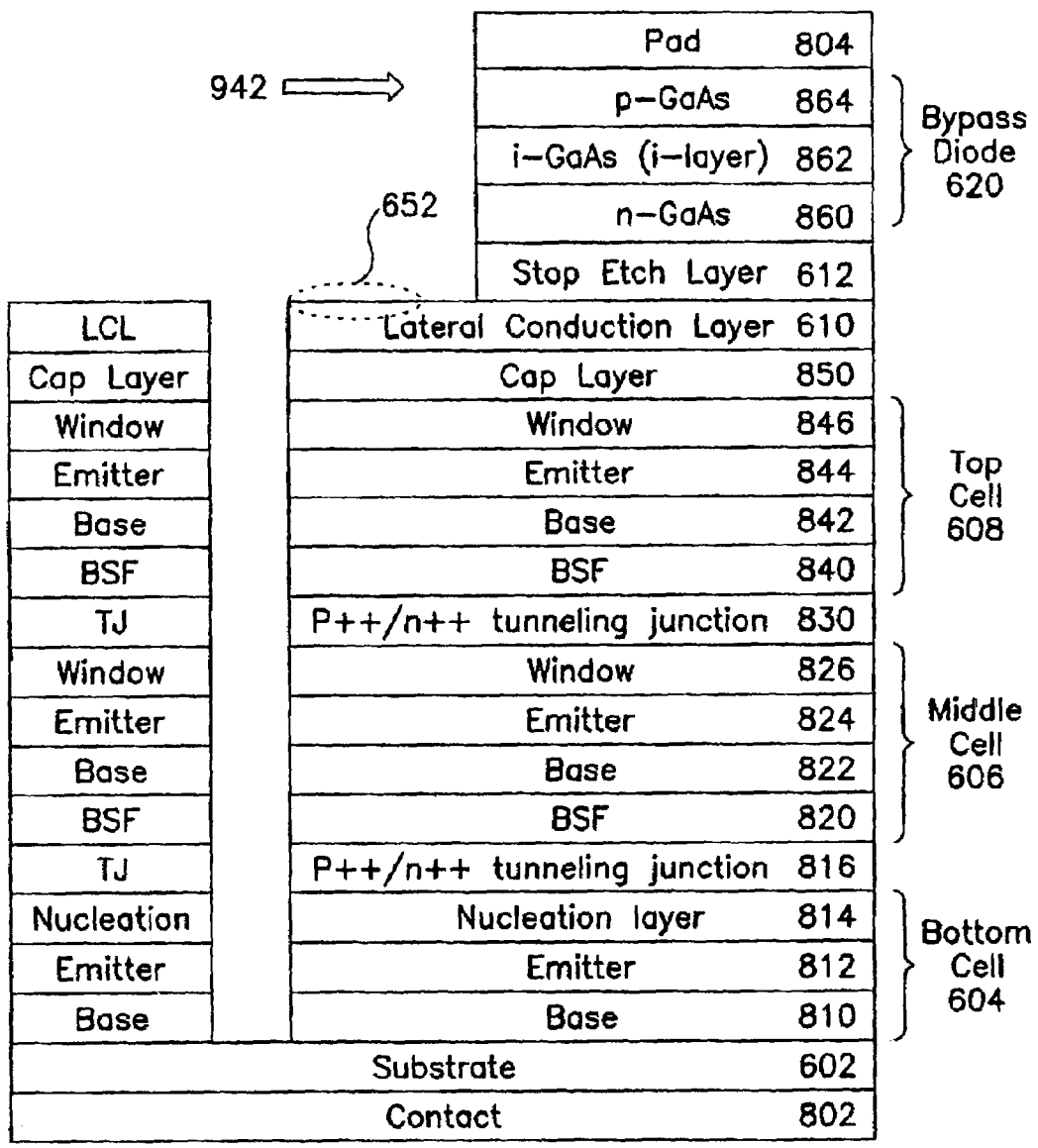
Figure 9E:
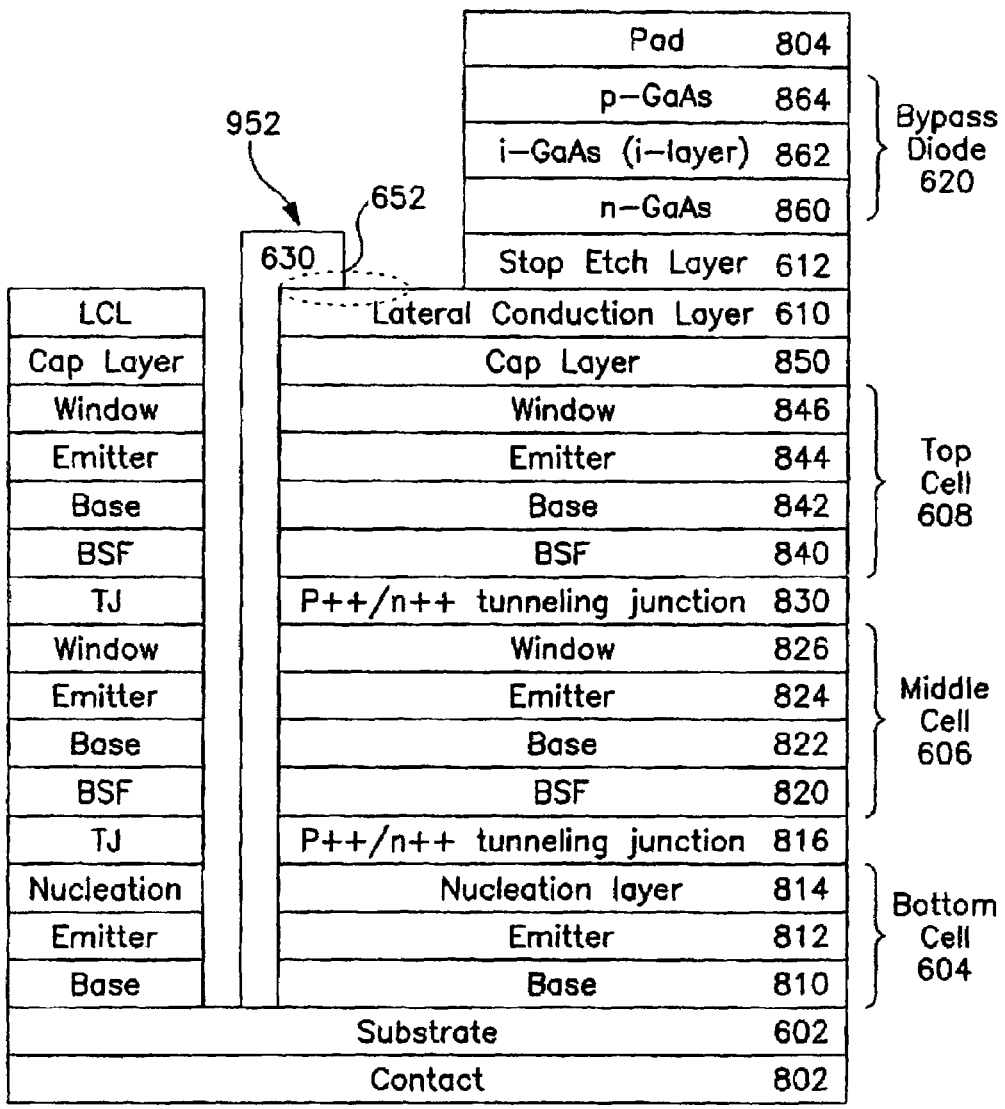

FIG. 9B illustrates that a portion 922 of bypass diode 602 has been etched away. FIG. 9C illustrates that a well 932 is created through an etching process, such as a mesa etch method. FIG. 9D illustrates that a second portion 942 of the bypass diode 620 is etched away. The stop etch layer 612 is, in one embodiment, used to control the etching process to remove the portion 942 of the bypass diode 620 to create a shunt contact pad 652. FIG. 9E illustrates the next step of formation of the shunt 952. It should be apparent to one skilled in the art that additional layers and steps may be added or deleted without departing from the scope of the present invention.

Figure 10:
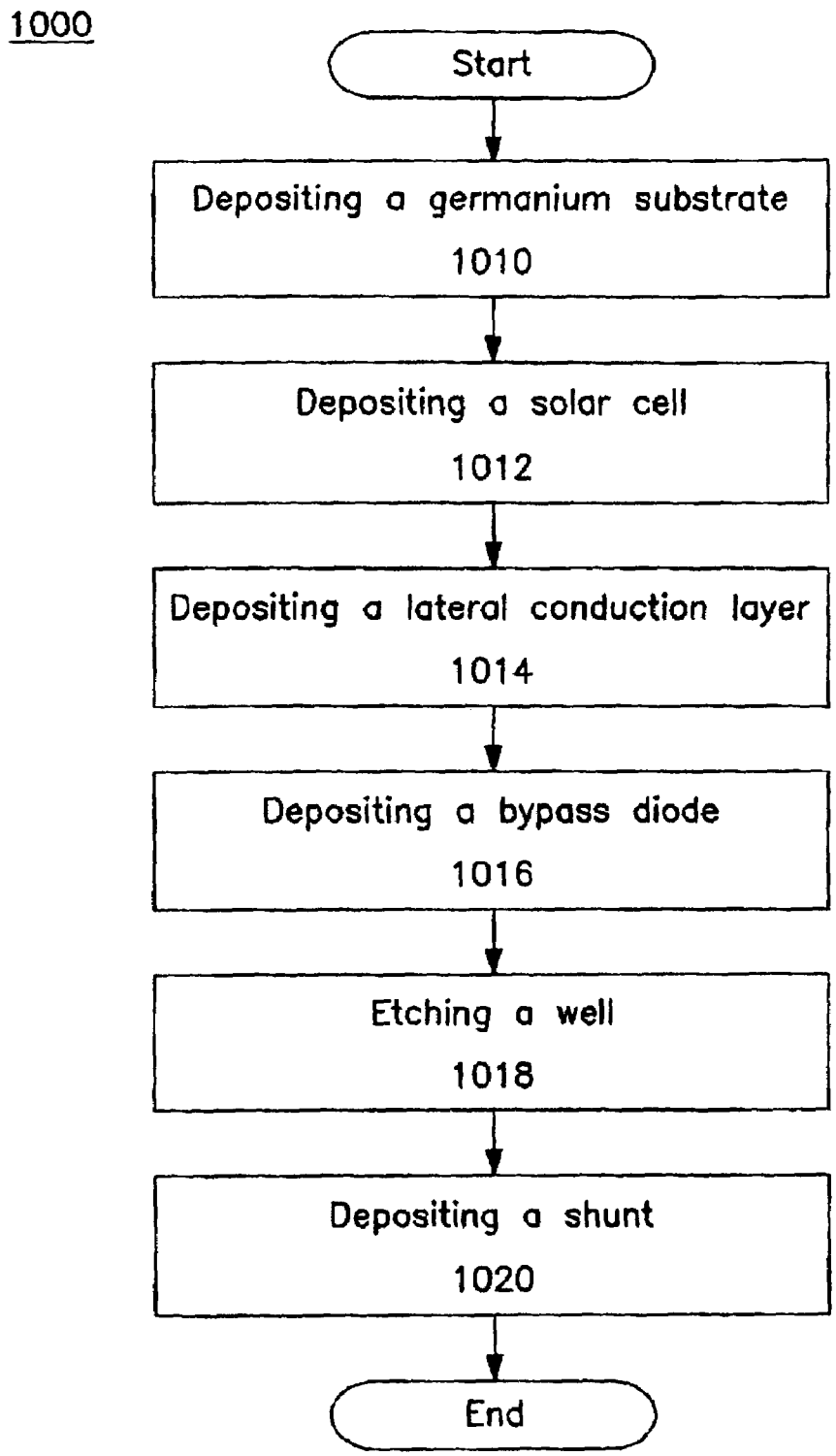
FIG. 10 is a flow chart illustrating a method of manufacturing a multijunction solar cell structure with a bypass diode in accordance with one embodiment of the present invention.

FIG. 10 is a flow chart 1000 illustrating a method of manufacturing a multijunction solar cell structure with a bypass diode in accordance with one embodiment of the present invention. At block 1010, the process deposits a germanium substrate. In one embodiment, the germanium substrate is deposited over a contact layer. Once the substrate is formed, the process moves to block 1012.

At block 1012, the process deposits a solar cell. In one embodiment, the solar cell is a triple junction solar cell, which includes a bottom, middle, and top subcells. Moreover, the bottom subcell may be a germanium solar subcell and the middle subcell may be a GaAs solar subcell. The top subcell may be a GaInP2 solar subcell. It should be noted that it does not depart from the scope of the present invention if the homojunction subcells are replaced with heterojunction subcells. After the solar cell is formed, the process proceeds to block 1014.

At block 1014, the process deposits a lateral conduction layer over the solar cell. In one embodiment, the lateral conduction layer is a n-doped GaAs layer, which is used as the shunt contact pad. Once the lateral conduction layer is deposited, the process proceeds to block 1016.

At block 1016, the process deposits a bypass diode over the lateral conduction layer. In one embodiment, after a stop etch layer is deposited on the lateral conduction layer, an n-type GaAs layer is deposited over the stop etch layer. After an i-type GaAs layer is deposited over the n-type layer, a p-type GaAs layer is deposited over the i-type layer. In one embodiment, the concentration of n dopant in the n-type GaAs layer is between $10^{17}$ to $10^{18}$. Like n-type layer, the concentration of p dopant in the p-type GaAs layer is between $10^{17}$ to $10^{18}$. In contrast, the concentration of dopant for i-tape GaAs layer is less than $10^{16}$. Once the bypass diode is formed, the process moves to block 1018.

At block 1018, a well or gap or space is created to provide electrical separation between the bypass diode and the solar cell. Well also allows the shunt to access the substrate. After the creation of well, the process proceeds to block 1020.

At block 1020, a shunt is deposited along a portion of the multijunction solar cell structure wherein one side of the shunt is connected to the substrate and another side of the shunt is connected to the shunt contact pad.

In the foregoing specification the invention has been described with reference to specific exemplary embodiments thereof. It will, however, be evident that various modifications and changes may be made thereto without departing from the broader scope of the invention. The specification and drawings are, accordingly, to be regarded in an illustrative rather than restrictive sense.

What is claimed is:

1. A solar cell semiconductor device comprising:
   a semiconductor body having a sequence of layers of semiconductor material including a first region in which the sequence of layers of semiconductor material forms a sequence of cells of a multijunction solar cell with a top layer of a top cell having a first polarity; and
   a second region in which the sequence of layers is laterally spaced apart and laterally separated from said first region and in which the sequence of layers forms a support for an integral bypass diode to protect said sequence of cells against reverse biasing at less than breakdown voltage, a bottom layer of the bypass diode having said first polarity;
   a metal layer in contact with the sequence of layers of semiconductor material disposed underneath the bypass diode in the second region, the metal layer shorting the layers of semiconductor material under the bypass diode in the second region;
   wherein the first region and the second region have an identical sequence of layers where each layer in the first region has the same composition and thickness as the corresponding layer in the second region, subject to normal manufacturing variations, and form the semiconductor body.

2. A solar cell semiconductor device comprising:
   a substrate;
   a first sequence of layers of semiconductor material deposited on said substrate, including a first region in which the sequence of layers of semiconductor material forms at least one cell of a multijunction solar cell where a top layer of a top cell has a first polarity;
   a second region including said first sequence of layers, and a second sequence of layers that forms a bypass diode to protect said at least one cell against reverse biasing at less than breakdown voltage where a bottom layer of the bypass diode has the same polarity as said first polarity of said top cell;
   a metal layer deposited on a portion of said substrate and over at least a portion of said second region for electrically shorting the first sequence of layers of said second region and to electrically connect to said bypass diode in said second region; and
   wherein the first region and the second region have an identical sequence of semiconductor layers where each layer in the second region has the same composition and thickness as the corresponding layer in the first region, subject to normal manufacturing variations, and form an integral semiconductor body and wherein said bypass diode includes p-type, i-type, and n-type layers.

3. A solar cell semiconductor device comprising:
   a substrate;
   an integral semiconductor body having a sequence of layers of semiconductor material deposited on said substrate including a first region in which the sequence of layers of semiconductor material forms a sequence of cells of a multijunction solar cell, with a top layer of a top cell having a first polarity; and
   a second region in which the sequence of layers is laterally spaced apart and laterally separated from said first region and in which the sequence of layers corresponding to the sequence of layers forming said cells forms a support structure for a bypass diode to protect said multijunction solar cell against reverse biasing at less than breakdown voltage, said bypass diode comprising a plurality of layers, wherein a bottom layer of said plurality of layers of the bypass diode has the same polarity as said first polarity of said top layer of said top cell;
   an electrically conductive shunt in contact with the sequence of layers of semiconductor material disposed between the bypass diode and the substrate in the second region, the shunt shorting the layers of semiconductor material in the second region;
   wherein the first region and the second region have an identical sequence of semiconductor layers where each layer in the first region has the same composition and thickness as the corresponding layer in the second region, subject to normal manufacturing variations, and form a portion of said integral semiconductor body.

4. A device as defined in claim 3, wherein the sequence of layers of said multijunction solar cell and the sequence of layers of the support structure are formed in the same process step.

5. A device as defined in claim 3, wherein the bypass diode comprises GaAs.

6. A solar cell semiconductor device comprising:
   a substrate;
   a sequence of layers of material deposited on said substrate, including a first region in which the sequence of layers of material forms a plurality of cells of a multijunction solar cell, and a second region in which the sequence of layers corresponding to the sequence of layers forming said cells forms a support for a bypass diode to protect said cell against reverse biasing;
   a planar lateral conduction layer deposited over the sequence of layers in the second region for making electrical contact to an active region of said bypass diode; and
   an electrically conductive shunt extending from the lateral conduction layer to the substrate in contact with the sequence of layers of material disposed underneath the bypass diode in the second region so that the layers of material under the bypass diode are shorted in the second region; wherein
   a topmost layer of a topmost cell has a first polarity; and
   a bottom layer of the bypass diode has the same said first polarity as said topmost layer of said topmost cell; wherein
   the first region and the second region have an identical sequence of semiconductor layers where each layer in the first region has the same composition and thickness as the corresponding layer in the second region, subject to normal manufacturing variations, and the first region and the second region constitute an integral semiconductor body.

7. A device as defined in claim 6, further comprising:
   a lateral conduction layer deposited over the sequence of layers in the first region;

wherein said lateral conduction layer in the first region is physically separated from the lateral conduction layer in the second region.

8. A device as defined in claim 6, wherein said lateral conduction layer is a highly doped layer.

9. A device as defined in claim 8, wherein said lateral conduction layer is composed of GaAs.

10. A device as defined in claim 6, further comprising an etch stop layer, deposited over said lateral conduction layer.

11. A device as defined in claim 6, wherein said substrate forms an electrical connection path between said multijunction solar cell and said bypass diode.

12. A solar cell semiconductor device comprising:
a substrate;
a sequence of layers of semiconductor material deposited on said substrate including a first region in which the sequence of layers of semiconductor material forms at least one cell of a multijunction solar cell, and a second region in which a sequence of layers corresponding to the sequence of layers forming said at least one cell forms a bypass diode that functions to protect said cell against reverse biasing; and
wherein the sequence of layers in the first and second regions includes a lateral conduction layer including a first portion disposed in said first region, and a second portion disposed in said second region and physically separated from said first portion; and further
wherein:
a metal layer is disposed between the second portion of the lateral conduction layer and the substrate in contact with the sequence of layers of semiconductor material disposed underneath the bypass diode in the second region, the metal layer shorting the layers of semiconductor material under the bypass diode in the second region;
a topmost layer of a topmost cell has a first polarity;
a bottom layer of the bypass diode has the same polarity as said first polarity of said topmost cell; and
the first region and the second region have an identical sequence of semiconductor layers where each layer in the first region has the same composition and thickness as the corresponding layer in the second region, subject to normal manufacturing variations, and form an integral semiconductor body.

13. A device as defined in claim 12, wherein said lateral conduction layer is a highly doped layer.

14. A device as defined in claim 12, wherein said lateral conduction layer is composed of GaAs.

15. A device as defined in claim 12, wherein one of the layers of said sequence of layers is a cap layer, and said lateral conduction layer is disposed directly over said cap layer.

16. A device as defined in claim 12, wherein said second portion of said lateral conduction layer makes electrical contact with a layer of said bypass diode.

17. A solar cell semiconductor device comprising:
a substrate;
a sequence of layers of semiconductor material deposited on said substrate including a first region in which a lower portion of said sequence of layers of semiconductor material forms a multijunction solar cell, and a second region in which an upper portion of said sequence of layers forms a bypass diode to protect said cell against reverse biasing at less than breakdown voltage;
a highly conductive lateral conduction layer deposited over the portion of said sequence of layers forming the multijunction solar cell, for making electrical contact with one layer of said bypass diode and forming a contact region to allow said bypass diode to be electrically connected to said multijunction solar cell; and
an electrically conductive shunt extending from the lateral conduction layer to the substrate in contact with the sequence of layers of semiconductor material disposed between the bypass diode and the substrate in the second region, the shunt shorting the layers of semiconductor material in the second region; wherein
a topmost layer of a topmost cell has a first polarity; and
a bottom layer of the bypass diode has the same polarity as said first polarity of said topmost cell; and
the first region and the second region have an identical sequence of semiconductor layers where each layer in the first region has the same composition and thickness as the corresponding layer in the second region, subject to normal manufacturing variations, and form an integral semiconductor body.

18. A device as defined in claim 17, wherein said lateral conduction layer includes a first portion disposed in said first region, and a second portion disposed in said second region and separated from the first portion, and the shunt is connected to the second portion of the lateral conduction layer.

19. A device as defined in claim 17, wherein said lateral conduction layer is composed of GaAs.

20. A device as defined in claim 18, wherein said second portion of said lateral conduction layer makes electrical contact with a first active layer of said bypass diode.

* * * * *

UNITED STATES PATENT AND TRADEMARK OFFICE
CERTIFICATE OF CORRECTION

PATENT NO.        : 7,759,572 B2                                   Page 1 of 1
APPLICATION NO. : 10/773343
DATED             : July 20, 2010
INVENTOR(S)       : Paul R. Sharps et al.

It is certified that error appears in the above-identified patent and that said Letters Patent is hereby corrected as shown below:

Column 1, line 12, "10/732,456" should be changed to --10/723,456--; line 29, delete "the".

Column 5, line 10, change "manufacture" to --manufacturing--.

Column 7, line 24, change "arsenic" to --arsenide--.

Column 8, line 27, change "interchangeable" to --interchangeably--; line 29, delete "in".

Column 10, line 9, change "(Ti)" to --(TI)--; line 10, insert --germanium-- before "Ge"; line 21, change "602" to --620--; line 45, change "GaInP2" to --GaInP$_2$--; line 65, change "i-tape" to --i-type--.

Column 11, line 3, change "Well" to --The well--.

Signed and Sealed this

Fifth Day of October, 2010

David J. Kappos
*Director of the United States Patent and Trademark Office*